United States Patent [19]

Chinone et al.

[11] 4,121,179

[45] Oct. 17, 1978

[54] SEMICONDUCTOR INJECTION LASER

[75] Inventors: Naoki Chinone, Kokubunji; Toshihiro Kawano, Hachioji; Hisao Nakajima, Tokorozawa, all of Japan

[73] Assignee: Hitachi, Ltd., Japan

[21] Appl. No.: 755,994

[22] Filed: Jan. 3, 1977

[30] Foreign Application Priority Data

Jan. 12, 1976 [JP] Japan ................................. 51-2072

[51] Int. Cl.$^2$ ............................................. H01S 3/19
[52] U.S. Cl. ................................. 331/94.5 H; 357/18
[58] Field of Search ................... 331/94.5 H; 357/16, 357/17, 18

[56] References Cited

U.S. PATENT DOCUMENTS 3,983,510   9/1976   Hayashi et al. ................... 31/94.5 H

*Primary Examiner*—Stanley D. Miller, Jr.
*Assistant Examiner*—James W. Davie
*Attorney, Agent, or Firm*—Craig & Antonelli

[57] ABSTRACT

A semiconductor injection laser device has a heterostructure wherein either of a p-layer and an n-layer which hold a lasing active layer therebetween is a semiconductor layer which has an energy band gap greater than that of the active layer, and the semiconductor injection laser device includes one of the semiconductor layers that adjoins the active layer being constructed of a semiconductor layer which has a stripe mesa portion and whose base part is $0.8\mu$ to $1.5\mu$ thick. The semiconductor injection laser device of this construction has a current injection region width limited by the width of the stripe mesa portion. As a result, not only a current flowing into the device can be made small, but also the device can be lased in a single mode of the lowest order with transverse modes of higher orders reduced.

4 Claims, 8 Drawing Figures

SEMICONDUCTOR INJECTION LASER

FIELD OF THE INVENTION

This invention relates to improvements in a semiconductor injection laser device with a heterostructure whose current injection region is formed into a stripe mesa.

PRIOR ART OF THE INVENTION

In the field of semiconductor injection laser devices, it is known that when at least one of a p-layer and an n-layer disposed on the upper and lower surfaces of a lasing active layer is made a semiconductor layer which has an energy band gap greater than that of the active layer, minority carriers injected into the active layer are confined within the active layer, so the threshold value of the lasing can be sharply lowered. In case of the semiconductor injection laser having wide electrodes, laser light thus obtained has transverse modes of higher orders and is multimode.

Figure 1:
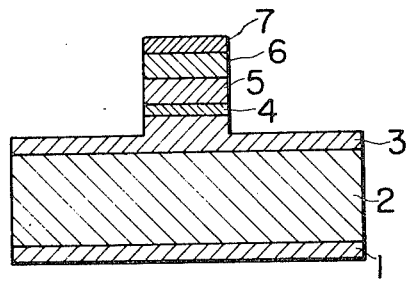
FIGS. 1 and 2 are vertical sectional views each showing a prior-art semiconductor injection laser device.
Figure 2:
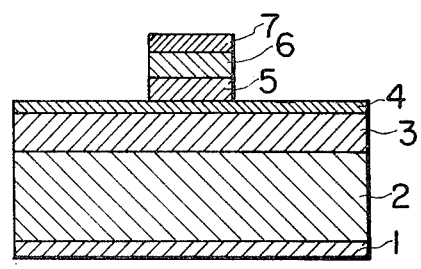

Further, in the semiconductor injection laser device of a heterostructure, in order to reduce the transverse modes, a stripe mesa structure has been attempted in which, as shown in FIG. 1 or FIG. 2, semiconductors other than a current injection region above an active layer are removed by the preferential chemical etching so as to form the current injection region in a stripe manner. In FIGS. 1 and 2, numeral 1 designates an n-side electrode, numeral 2 an n-GaAs substrate, numeral 3 an n-Ga$_{1-x}$Al$_x$As (0.2 $\leq$ x $\leq$ 0.6) layer, numeral 4 the GaAs active layer, numeral 5 a p-Ga$_{1-x}$Al$_x$As layer, numeral 6 a p-GaAs layer, and numeral 7 a p-side electrode. In order to reduce the contact resistance between the layer 5 and the electrode 7, the layer 6 is made of GaAs.

However, when the semiconductor layer other than the current injection region is taken away to the part of the active layer 4, as in FIG. 1, the laser operation portion is held between side walls exhibiting a large difference of refractive indexes. This involves the difficulty that the higher order modes are prone to oscillate. On the other hand, when the etching is done so as to leave the active layer 4 unetched as in FIG. 2, the optical loss increases, and besides, the active layer is exposed directly to the air, which is unfavorable in point of reliability.

SUMMARY OF THE INVENTION

This invention has been made in order to eliminate the aforecited disadvantages in the semiconductor injection laser devices of the heterostructure type, and has for its object to provide a semiconductor injection laser device whose threshold current is small and whose transverse modes of higher orders are reduced.

This invention consists in a semiconductor injection laser device wherein at least one of a p-layer and an n-layer adjoining the upper and lower surfaces of an active layer respectively is constructed of a semiconductor layer which has an energy band gap greater than that of the active layer, characterized in that either the p-layer or the n-layer adjoining the active layer is constructed of a semiconductor layer which has a stripe-mesa portion and whose base part is 0.8 $\mu$ to 1.5 $\mu$ thick.

With the above construction of the semiconductor injection laser device, not only the threshold injection current density can be made small, but also the laser can be lased in a single mode of the lowest order with transverse modes of higher orders reduced.

DESCRIPTION OF THE PREFERRED EMBODIMENT

Hereunder, an embodiment of this invention will be described.

Figure 3:
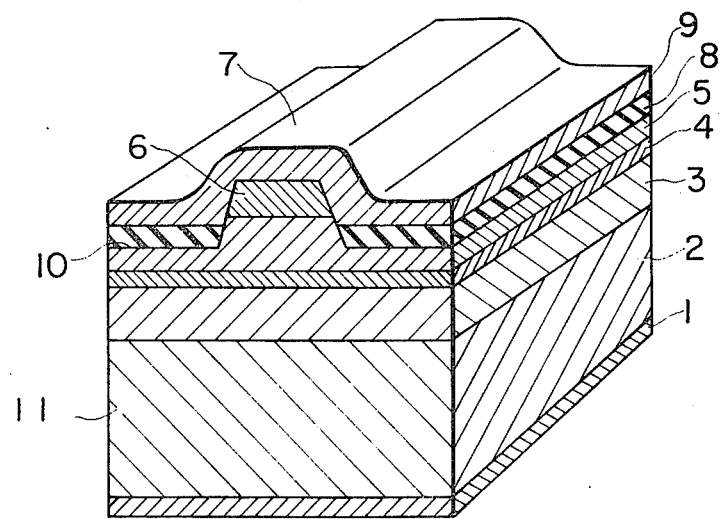
FIG. 3 is a perspective view showing the construction of a semiconductor injection laser device according to this invention.
Figure 4:
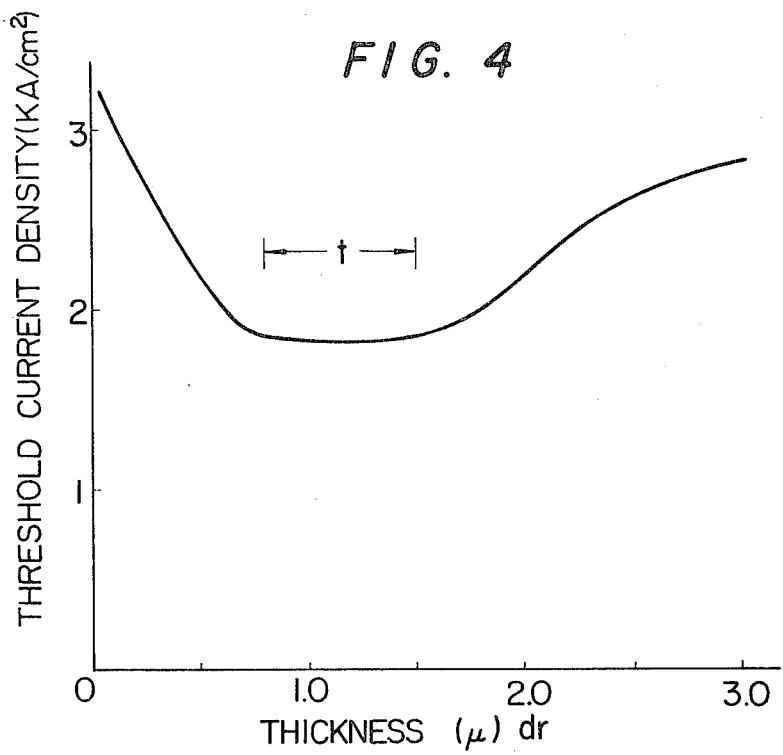
FIG. 4 is a characteristic diagram showing the relationship in the semiconductor injection laser device of this invention between the thickness $dr$ of the base part of a stripe mesa layer and the threshold current density of lasing.

FIG. 3 is a view showing an example of the construction of a stripe-mesa structure semiconductor injection laser device to which this invention is applied. In the figure, numeral 1 designates an n-side electrode, numeral 2 an n-GaAs substrate, numeral 3 an Sn-doped n-Ga$_{1-x}$Al$_x$As layer (0.20 $\leq$ x $\leq$ 0.60), numeral 4 a GaAs active layer, numeral 5 a Ge-doped p-Ga$_{1-x}$Al$_x$As layer, numeral 6 a Ge-doped p-GaAs layer, numeral 7 a current injection region, numeral 8 an SiO$_2$ film, numeral 9 a p-side electrode, numeral 10 an etched surface of the p-Ga$_{1-x}$Al$_x$As layer (0.20 $\leq$ x $\leq$ 0.60) 5, and numeral 11 a reflective surface. Such structure can be manufactured by well-known semiconductor techniques. By way of example, the layers 3, 4, 5 and 6 are formed on the n-GaAs substrate 2 by the continuous liquid phase epitaxial growth. Thereafter, both the sides of the stripe current injection region 7 are preferentially etched to the extent that the active layer 4 is not reached, and the p-Ga$_{1-x}$Al$_x$As layer 5 is made thin. Now, let $dr$ denote the thickness of the base part or thin part of the p-Ga$_{1-x}$Al$_x$As layer 5, in other words, the thickness from the active layer 4 to the surface 10 of the part subjected to the preferential etching. The variation of the threshold current density versus the thickness $dr$ at a stripe width of 20 microns ($\mu$) was actually measured, and the result is illustrated in FIG. 4. The dependency of the threshold current density on the thickness $dr$ differs according to the stripe width. However, when the thickness $dr$ is 1.5 $\mu$ or above, the threshold current density increases rapidly irrespective of the stripe width. This is because the current spreads on both the sides of the stripe portion. In this case, as the stripe width becomes smaller relative to an identical value of the thickness $dr$, the threshold current density becomes greater. The cause therefor is that carriers injected into the active layer 4 spread onto both the sides of the stripe portion within the active layer.

On the other hand, also when the thickness $dr$ is 0.8 $\mu$ or below, the threshold current density increases rapidly. In particular, in case where the stripe width is small, the tendency of the increase of the threshold current density is conspicuous. This is because the light loss increases due to a process as stated below. In the case where the stripe width is small, the laser light penetrates outside of the stripe portion. When the thickness $dr$ is large, both the sides of the stripe are also excited owing to the current spreading effect, and the loss attributed to the penetration of the laser light is low. In contrast, when the thickness $dr$ is small, a portion of small refractive index (usually, the oxide film 8) is extremely close to the active layer 4, and hence, the light penetrating on both the sides of the stripe portion 7 exists in waveguides of asymmetric refractive indexes and penetrates much towards the GaAs substrate 2. The absorption coefficient of the GaAs substrate 2 is very large (2 × $10^4$ cm$^{-1}$), so that when the light penetrates even slightly, the loss becomes heavy to an unnegligible extent. In case where the stripe width is large, the penetration of the light to any portion other than the stripe portion is relatively little, and hence, the loss described above is difficult to arise.

Figure 5:
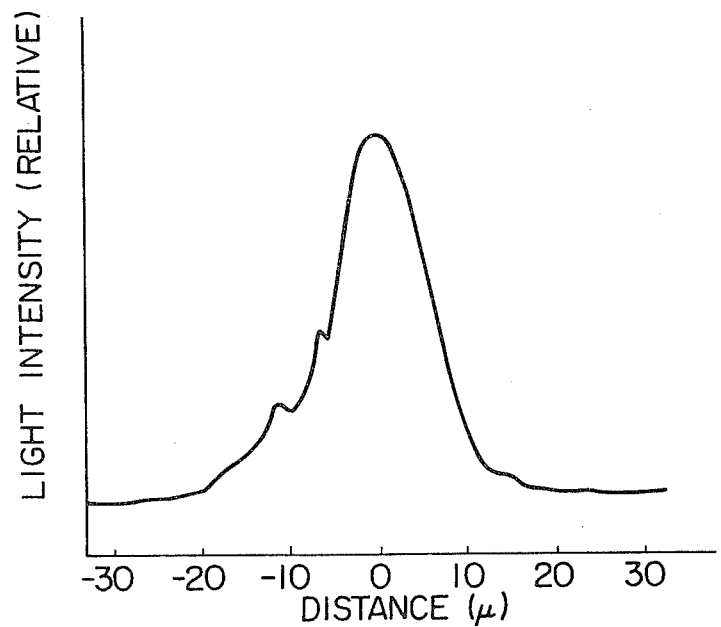
FIG. 5 illustrates a near field pattern obtained when the thickness $dr$ of the base part of the stipe mesa layer is 0.8 $\mu$ in the semiconductor injection laser device of this invention.
Figure 6:
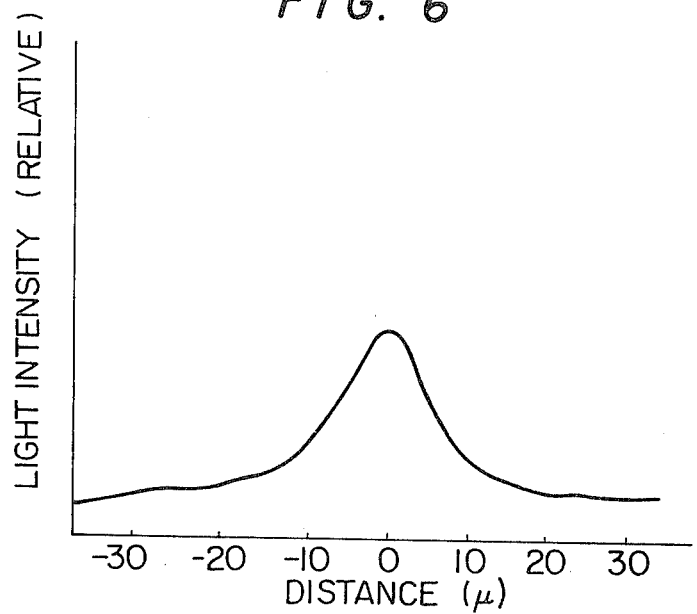
FIG. 6 illustrates a near field pattern obtained when the thickness $dr$ of the base part of the stripe mesa layer is 1.5 $\mu$ in the semiconductor injection laser device of this invention.
Figure 7:
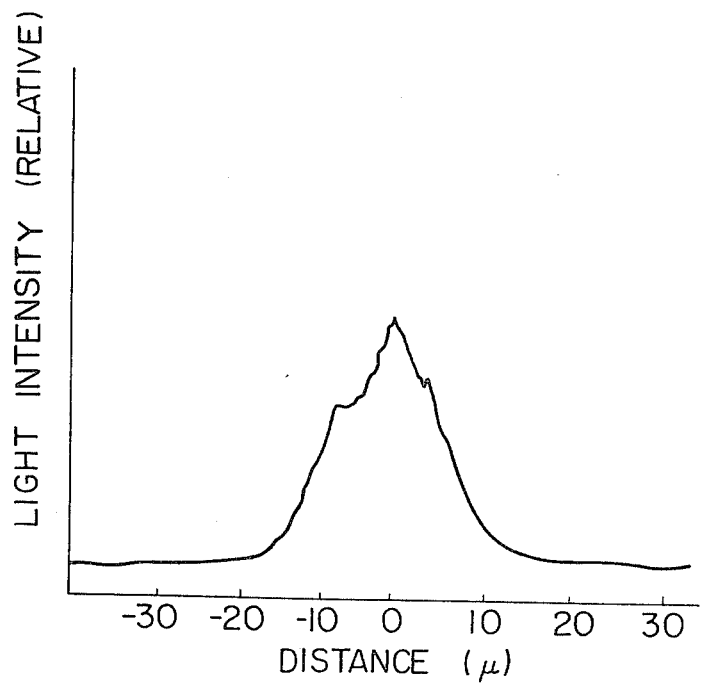
FIGS. 7 and 8 illustrate near field patterns obtained when the thickness $dr$ of the base part of the stripe mesa layer is 0.6 $\mu$ and 0.7 $\mu$ in the semiconductor injection laser device of this invention, respectively.
Figure 8:
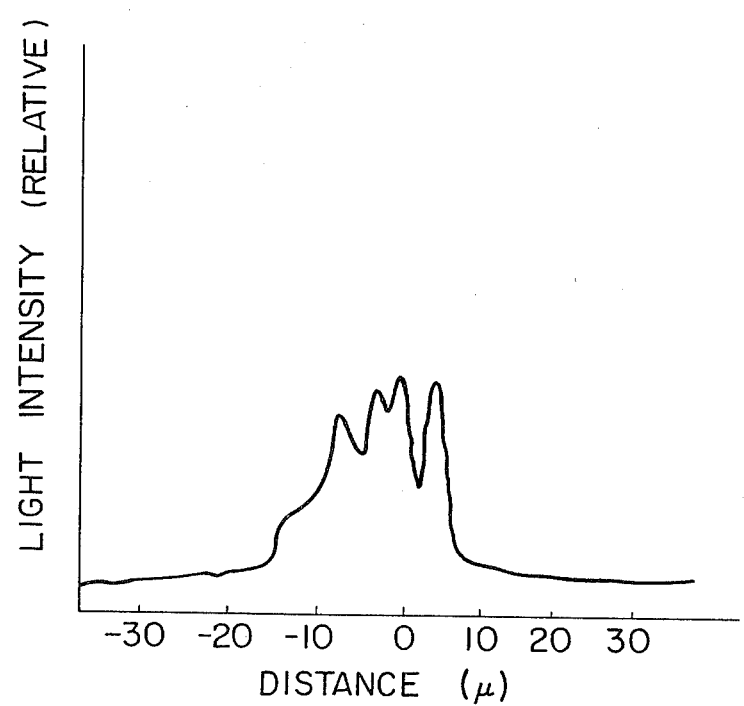

The near field pattern (mode pattern on the reflective surface of the laser cavity) in the semiconductor injection laser of the above stripe-mesa structure is illustrated in FIG. 5 as to a case where $dr$ = 0.8 $\mu$, and in FIG. 6 as to a case where $dr$ = 1.5 $\mu$. As apparent from the figures, the single mode is acquired in both the cases. However, in cases where $dr$ = 0.7 $\mu$ and where $dr$ = 0.6 $\mu$, as illustrated in FIG. 7 and FIG. 8 respectively, sharp peaks of light intensities appear, higher order modes develop and the multi-mode operation is done (in any case, the operating current of the laser device is 120 mA). The reason therefor will be that, since the current spread is small, a carrier distribution within the active layer becomes nearly rectangular, the gains of the higher order modes become large and the gain difference among the modes becomes null.

In order to operate the semiconductor laser at a low current and to stabilize the mode characteristic, it is more desirable to make the stripe width at most 20 $\mu$. As understood from FIG. 4, when the thickness $dr$ is set within the range $t$ between 0.8 $\mu$ and 1.5 $\mu$, the increase of the threshold current density can be suppressed to the minimum. For example, in the case where the stripe width is 20 $\mu$, the threshold current density can be suppressed to about 1.8 times in comparison with that of a semiconductor laser having electrodes of large width. As stated above, the loss is heavy for the laser light having penetrated to any portion other than the stripe portion, so that the lasing at the lowest order mode is easy.

Now, description will be made of the method of fabricating the mesa stripe structure semiconductor injection laser according to this invention.

By the continuous liquid phase epitaxial growth, the Sn-doped n-Ga$_{1-x}$Al$_x$As (for example, $x$ = 3) layer 3, non-doped GaAs active layer 4, Ge-doped p-Ga$_{1-x}$Al$_x$As layer 5 and Ge-doped p-GaAs layer 6 are successively grown on the n-GaAs substrate 2. Subsequently, via a photo-resist process, an SiO$_2$ film is deposited on the surface of the p-GaAs layer 6 to become the part of the current injection region, in the form of a stripe by the chemical vapor deposition. Using the SiO$_2$ film as a mask, both the outer sides of the current injection region are removed down to a predetermined depth by the chemical etching, and the corresponding parts of the p-Ga$_{1-x}$Al$_x$As layer 5 are thinned down to a predetermined thickness. As an etchant at this time, there is an HF series, an HCl series, an H$_2$SO$_4$ series, an H$_3$PO$_4$ series or the like. When, as an example, an etchant in which H$_3$PO$_4$, H$_2$O$_2$ and CH$_3$OH are mixed in proportions of 1 : 1 : 3 is employed, a comparatively flat etched surface is obtained. Thereafter, the stripe-formed SiO$_2$ film is removed. Via a photo-resist process, the SiO$_2$ film 8 is again deposited on the parts other than the current injection region, and the metal contact 9 is evaporated onto the entire surface of the crystal. Further, the substrate 2 is chemically etched from the rear surface so as to make its thickness about 100 $\mu$, and the metal contact on the substrate side, 1 is evaporated onto the rear surface of the resultant substrate. Thereafter, the reflective surface 11 is made by the cleavage, and the resultant structure is split into individual elements by the scribing.

As set forth above, according to this invention, there can be attained good characteristics which have not been achieved by a laser wherein only an electrode is formed into a stripe or by the laser wherein the mesa stripe is formed by the etching getting to the active layer. That is, the low current operation and the fundamental mode lasing become possible in such a way that, as in this invention, the distance $dr$ from the active layer to the surface of the preferentially etched parts on both the sides of the mesa-like current injection region is set within the range of from 0.81 $\mu$ to 1.5 $\mu$. As an example, in the case where the stripe width was 20 $\mu$, elements whose threshold currents were at most 80 mA at the fundamental mode lasing were produced at a good yield rate. In this case, the threshold current of an element whose thickness $dr$ was 2 $\mu$ was 140 mA.

Regarding the materials of the semiconductor injection laser device in the foregoing embodiment, there is employed the double heterostructure in which the active layer is of GaAs and both the stripe mesa layer and the layer on the opposite side holding the active layer therebetween are of Ga$_{1-x}$Al$_x$As (where 0 < $x$ < 1). However, there may well be employed a double heterostructure in which the active layer is made of Ga$_{1-x}$Al$_x$As and the two layers over and under the active layer are respectively made of Ga$_{1-y}$Al$_y$As and Ga$_{1-z}$Al$_z$As (where 0 < $x$ < 1, 0 < $y$ < 1, 0 < $z$ < 1 and $x$ < $y$ ≦ $z$). Also employable is a single heterostructure in which the active layer is made of GaAs and the two upper and lower layers are respectively made of Ga$_{1-x}$Al$_x$As (0 < $x$ < 1) and GaAs.

Although, in the above, the heterostructure of the GaAs-Ga$_{1-x}$Al$_x$As or Ga$_{1-y}$Al$_y$As-Ga$_{1-x}$Al$_x$As system has been exemplified, this invention can of course be applied to a laser which uses any other materials such as Ga$_{1-x}$In$_x$P-Ga$_{1-x}$Al$_x$As system or to a laser which has any other structure such as multi-heterostructure.

We claim:

1. In a semiconductor injection laser device including at least one of a p-layer and an n-layer, respectively contiguous to upper and lower surfaces of an active lasing layer, said p-layer and said n-layer being a semicondutor material which has an energy band gap greater than that of the active lasing layer, and electrodes being respectively provided on a semiconductor on the p-layer side and on a semiconductor on the n-layer side, said semiconductor injection laser device comprising that one of said p-layer and said n-layer contiguous to said upper and lower surfaces of said active layer is made of a semiconductor material which has a stripe mesa portion, and which has a base part extending under and out of said stripe mesa portion, said base part being $0.8\mu$ to $1.5\mu$ thick.

2. The semiconductor injection laser device according to claim 1, characterized in that said active layer is of GaAs, that said p-layer and said n-layer contiguous to said active layer are of $Ga_{1-x}Al_xAs$ ($0 < x < 1$), and that the p-side electrode is a metal electrode which is in ohmic contact through a p-GaAs layer, while the n-side electrode is a metal electrode which is in ohmic contact through an n-GaAs layer on an n-$Ga_{1-x}Al_xAs$ layer.

3. The semiconductor injection laser device according to claim 1, characterized in that said active layer is of $Ga_{1-x}Al_xAs$ (where $0 < x < 1$), that said p-layer and said n-layer contiguous to said active layer are of $Ga_{1-y}Al_yAs$ and $Ga_{1-z}Al_zAs$ (where $0 < y < 1$, $0 < z < 1$ and $x < y \leqq z$) respectively, and that the p-side electrode is a metal electrode which is in ohmic contact through a p-GaAs layer on the p-layer, while the n-side electrode is a metal electrode which is in ohmic contact through a p-GaAs layer on the n-layer.

4. The semiconductor injection laser device according to claim 1, characterized in that said active layer is of GaAs, that said p-layer and said n-layer contiguous to said active layer are of $Ga_{1-x}Al_xAs$ (where $0 < x < 1$) and GaAs respectively, and that a metal electrode is in ohmic contact directly on the GaAs layer, while a metal electrode is in ohmic contact on the $Ga_{1-x}Al_xAs$ layer through a GaAs layer of the same conductivity type.

* * * * *